United States Patent
Bontempo

(10) Patent No.: US 6,313,684 B1
(45) Date of Patent: Nov. 6, 2001

(54) CURRENT PULSE GENERATOR WITH PROCESS- AND TEMPERATURE-INDEPENDENT SYMMETRIC SWITCHING TIMES

(75) Inventor: Gregorio Bontempo, Barcellona (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/454,317

(22) Filed: Dec. 3, 1999

(30) Foreign Application Priority Data

Dec. 17, 1998 (IT) .............................. MI98A2724

(51) Int. Cl.[7] ............................................ G06F 1/04
(52) U.S. Cl. ........................... 327/295; 327/103; 327/513
(58) Field of Search .............................. 327/52, 54, 89, 327/295, 296, 513, 103

(56) References Cited

U.S. PATENT DOCUMENTS

| | | | |
|---|---|---|---|
| 3,569,744 | * | 3/1971 | Garrahan .............................. 327/227 |
| 3,946,253 | * | 3/1976 | Solberg .................................. 327/72 |
| 3,982,193 | * | 9/1976 | Maringer .............................. 327/114 |
| 4,433,252 | * | 2/1984 | Lewis .................................... 327/398 |
| 4,611,154 | * | 9/1986 | Lambropoulos et al. ........... 324/177 |
| 4,816,748 | * | 3/1989 | Tazawa et al. ......................... 324/65 |
| 6,046,615 | * | 4/2000 | Chevallier et al. .................. 327/143 |

* cited by examiner

Primary Examiner—Terry D. Cunningham
(74) Attorney, Agent, or Firm—Lisa K. Jorgenson; Allen, Dyer, Doppelt, Milbrath & Gilchrist, P.A.

(57) ABSTRACT

A current pulse generator with process-independent and temperature-independent symmetric switching times, includes a differential stage which is adapted to generate a transmission current and a circuit for driving the differential stage which is adapted to generate a control voltage for the differential stage. The generator also includes a circuit for compensating the variations in the values of degeneration resistors of the differential stage, to generate, with the differential stage driving circuit, a current for controlling the differential stage, to keep the switching times of the current pulses of the generator substantially unchanged and symmetrical despite variations in the manufacturing process of the generator and the temperature.

36 Claims, 3 Drawing Sheets

CURRENT PULSE GENERATOR WITH PROCESS- AND TEMPERATURE-INDEPENDENT SYMMETRIC SWITCHING TIMES

FIELD OF THE INVENTION

The present invention relates to current pulse generators, and more particularly, to current pulse generators with process-independent and temperature-independent symmetric switching times.

BACKGROUND OF THE INVENTION

Current pulse generators are typically used in telephone or telecommunications applications, for example, in a system for communication between sensors and actuators which uses the (unshielded) power supply line for data transmission and operates in an industrial environment where electromagnetic interference is present and there are problems due to the nature of the transmission medium itself. These problems can cause data loss and particular care must therefore be taken regarding the waveform of the signal used to transmit the data, particularly regarding the times for transition from one state to the other.

Many factors can influence data transmission between active nodes or can interfere with nearby equipment. For example, the nature of the transmission medium is one of the factors that can influence data transmission. When a waveform travels along any communication channel, it loses part of its energy due to interaction between the waveform and the structure of the channel itself. This energy loss leads to an attenuation of the low- and high-frequency harmonics, with a consequent distortion of the signal during reception. It is therefore necessary to use waveforms whose harmonic components lie within the frequency band of the channel. Another negative factor is electromagnetic interference. The line over which current pulses travel is a source of electromagnetic forces which radiate energy (since the line is unshielded) into the surrounding environment, interfering with nearby equipment. A limit to this phenomenon is achieved by limiting the frequency band of the transmitted signal, limiting its switching times.

Another interference factor is noise induced externally. Due to the switching of electric circuit breakers, to the starting of neon lamps, electric motors, etc., additional and local voltages may be generated which by electromagnetic coupling to the line can cause overcurrents which are added to the transmitted signal. Bits which alter the content of the transmitted message are therefore added to the received signal. This effect is minimized by using, for each bit to be transmitted, two waveforms with opposite phases which are sent simultaneously over both wires of the line. In this manner the advantage of keeping the current absorbed by the line during transmissions constant is also achieved.

When a plurality of devices arranged physically distant from each other are used in the same system, these devices can have different electrical performance due both to the variations in the manufacturing process and to the difference in the operating temperatures to which they are subjected. These variations affect the switching times of the pulse and can therefore cause errors.

During reception, the acquired signal is sampled at a frequency which is higher than the transmission frequency and is then processed so as to extract the information contained therein. A change in the switching times results in a variation in the duration of the pulse and therefore a different reading of the number of samples. If this difference becomes large, the information associated with the pulse may be lost. The transmission protocol sets the maximum value of the error that can occur during reception to a value which is a fraction, e.g. a few percent, of the transmission frequency.

Therefore, the waveform of the current that flows over the two lines is desirably of the type shown in FIG. 1, where I+ and I− are currents flowing on the two lines, Idc is the average current that flows over the line, and T, $T_s$ and $T_d$ are the duration and the switching times of the pulse. One circuit solution capable of generating a pulse of the type shown in FIG. 1 is shown in FIG. 2, where the signal to be transmitted is applied as a logic state to the inputs Vdiff of a differential pair Q1, Q2 provided by two bipolar transistors.

The current I+ that flows over the line at the voltage V+ is provided by the collector current Ic1, while the current I− that flows over the line at the voltage V− is provided by the collector current Ic2, mirrored by two PNP transistors Q3 and Q4. The inductors L1 and L2 are meant to prevent the signal from returning toward the power supply Vdc, closing instead on a capacitor C arranged on the receiver of the successive node. The biasing current IL is chosen so as to be constant, using a constant-current source external to the device.

The core of the circuit is provided by the differential pair Q1 and Q2. It is known that the collector currents of the two transistors Q1 and Q2 depend on the value of the driving voltage Vdiff. For voltages in the interval +/− 26 mV, their behavior is linear with respect to the input voltage.

$$Ic1 = \frac{IL}{2}\left[1 - \frac{1}{2Vt}Vdiff\right] \cdot Ic2 = \frac{IL}{2}\left[1 + \frac{1}{2Vt}Vdiff\right]$$

where Vdiff is the driving voltage, IL is the biasing current and Vt is the thermal voltage.

The duration of the transition times T(s,d) (with reference to FIG. 1) of the collector currents is obtained by differentiating the currents Ic1 and Ic2 with respect to time:

$$\frac{\Delta Ic}{\Delta T} = \frac{\Delta Vdiff}{\Delta T}\frac{IL}{4Vt}$$

where $\Delta Ic1 = \Delta Ic2 = \Delta Ic$ and $\Delta(Vdiff)/\Delta T$ is the variation in the control voltage as a function of time. By defining the switching times T(s,d) as the rise and fall times of the currents Ic1 and Ic2, one obtains, by rewriting the above equation in terms of T(s,d):

$$Ts, \quad d = A\frac{\left(Vt\frac{1}{\Delta Vdiff}\right)}{\Delta T} \quad \text{where } A \text{ is a coefficient.}$$

Assuming $\Delta(Vdiff)/\Delta T$ to be constant, the term T(s,d) is a function of the term Vt, which depends in a linear fashion on the temperature according to the rule Vt=KT/q, and therefore:

$$Ts, d(T) = \alpha Vt(T)$$

For temperature variations in the range between −40° and +125°, the resulting absolute variation in switching times is unacceptable. If the error on the currents introduced by the difference between the transistors Q1 and Q2 is added to this, the switching time variation deteriorates even further.

An improvement to the circuit of FIG. 2 is achieved, as shown in FIG. 3, by adding degeneration resistors in series to the emitters of the differential stage formed by the transistors Q1 and Q2. In this manner, by adding resistors R, the input dynamic range is increased and at the same time both Vt and the error due to the difference between the transistors Q1 and Q2 becomes negligible. FIG. 3 also includes the circuit for driving the differential stage, which is formed by a capacitor C1 and by a current source I=I* which are driven in a push-pull configuration by the voltage Vin. In this case, the voltage variation D(Vdiff)DT depends on the charging and discharging of the capacitor C1 at a constant current I according to the relation:

$$\frac{\Delta Vdiff}{\Delta T} = I$$

With these constraints, the switching times T(s,d) with respect to the circuit of FIG. 3 are:

$$Ts, d = \frac{IL}{I} ARC1$$

where A is a coefficient and R is the value of the degeneration resistor which is series-connected to the emitter terminals of the transistors Q1 and Q2.

The dynamic range of the voltage Vdiff=V1−V2 is +/−R*IL, approximately 1 volt, so that the term Vt (26 mV) becomes negligible; moreover, the offset of the differential stage is due to the degeneration resistors R, which can be produced with a higher accuracy than the pair of transistors Q1 and Q2. However, also with this solution, the switching times are not perfectly controlled and independent of process and temperature variations.

SUMMARY OF THE INVENTION

An object of the present invention is to provide a current pulse generator with switching times which are symmetric, process-independent and temperature-independent. An object of the present invention is to provide a current pulse generator with process-independent and temperature-independent symmetric switching times which has low electromagnetic emission. Another object of the present invention is to provide a current pulse generator with process-independent and temperature-independent symmetric switching times in which the variation in the switching times is extremely small.

Another object of the present invention is to provide a current pulse generator with process-independent and temperature-independent symmetric switching times which is highly reliable, relatively easy to manufacture and at competitive costs. These objects and others which will become apparent hereinafter are achieved by a current pulse generator with process-independent and temperature-independent symmetric switching times, comprising a differential stage which is adapted to generate a transmission current and a circuit for driving the differential stage which is adapted to generate a control voltage for the differential stage. The current pulse generator comprises a circuit for compensating the variations in the values of degeneration resistors of the differential stage, to generate, with the differential stage driving circuit, a current for controlling the differential stage, to keep the switching times of the current pulses of the generator substantially unchanged and symmetrical despite variations in the manufacturing process of the generator and the temperature.

BRIEF DESCRIPTION OF THE DRAWINGS

Further characteristics and advantages of the present invention will become apparent from the following detailed description of a preferred embodiment of the generator according to the invention, illustrated only by way of non-limitative example in the accompanying drawings, wherein.

DETAILED DESCRIPTION OF THE PREFERRED EMBODIMENTS

Figure 1:
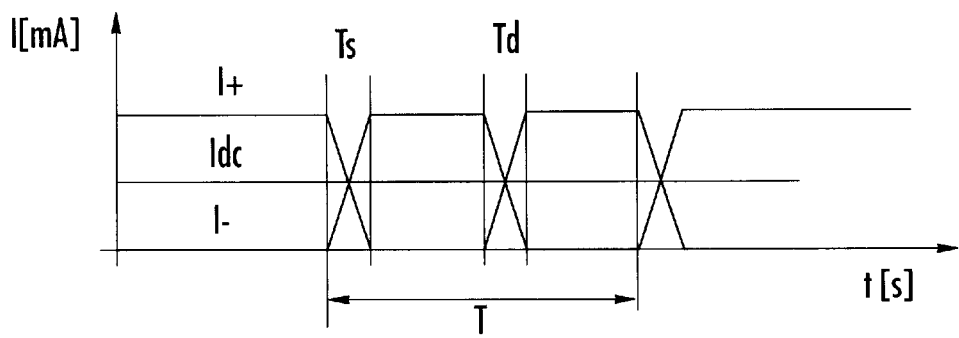
FIG. 1 is a graph showing a desirable behavior of a current pulse.
Figure 2:
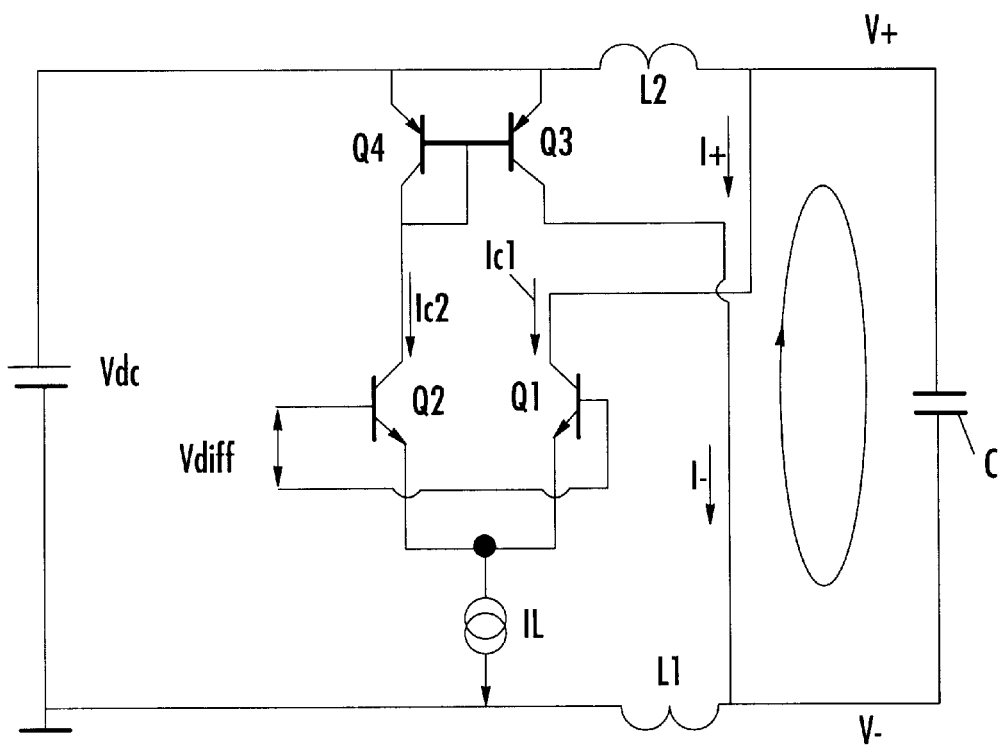
FIG. 2 is a diagram of a conventional circuit for generating a current pulse with controlled switching times.
Figure 3:
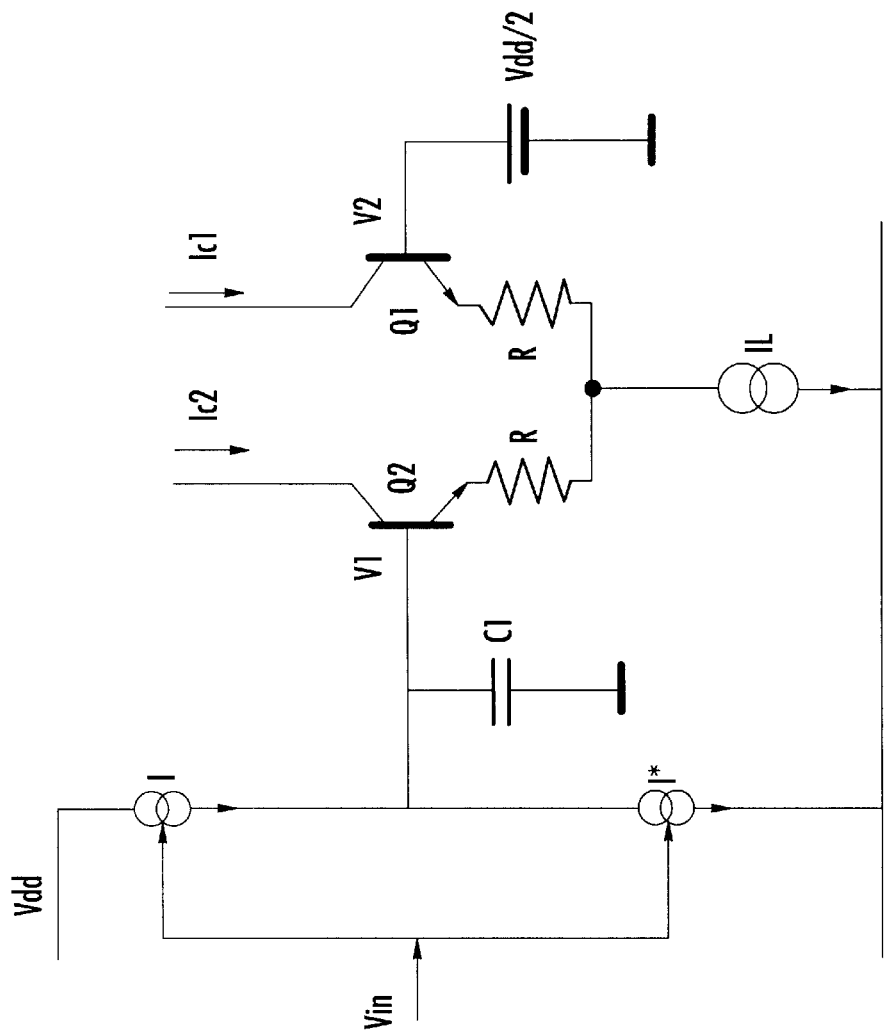
FIG. 3 is a diagram of another conventional circuit for generating pulses with controlled switching times.

With reference to the above figures, the current pulse generator according to the present invention, generally designated by the reference numeral 1, comprises a differential stage 2, like the circuit of FIG. 3, which is composed of two bipolar transistors Q1 and Q2 of the NPN type. Also, the current pulse generator 1 includes respective resistors R, biased by a current source IL, which are series-connected to the emitters of the bipolar transistors Q1 and Q2.

Figure 4:
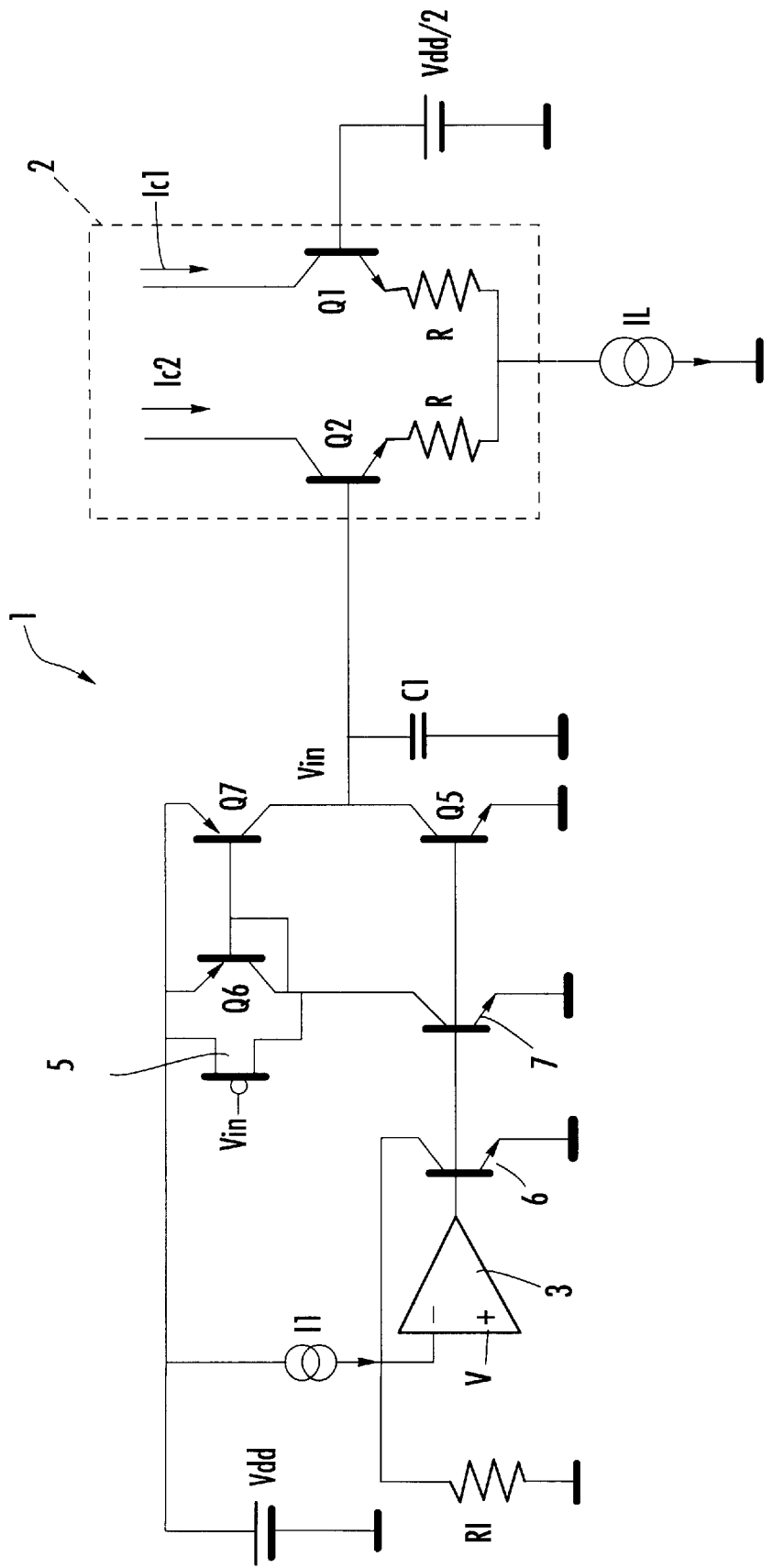
FIG. 4 is a diagram of the circuit according to the present invention.

It is noted that FIG. 4 uses the same reference signs as FIG. 3 for corresponding elements. The base terminal of the transistor Q1 is connected to a source of voltage Vdd/2 and the base terminal of the bipolar transistor Q2 is connected to a stage driving circuit which is provided differently with respect to the circuit shown in FIG. 3. The differential stage 2 generates the transmission current. The circuit according to the invention uses the differential stage 2, choosing a particular charging current I whose rule of variation is complementary to the rule of variation of the resistor R. The current I is given as the difference between the current I1 and the ratio V/R1, i.e., I=(I1−V/R1), where I is the charging current of the capacitor C1, I1 is a constant current, V is a constant voltage and R1 is a resistor which is similar to the degeneration resistors R (shown in FIGS. 3 and 4) with respect to the parameter variations that it can undergo due to manufacturing process variations, temperature variations, and aging.

The circuit according to the invention further has an operational amplifier 3 which receives the voltage V in input to the non-inverting terminal and the current I1 in input to the inverting terminal. The current reaches a node to which a resistor R1 is connected and the resistor R1 is then connected to the ground. The output of the operational amplifier 3 is connected to a set of three PNP bipolar transistors which have common-connected base terminals and ground-connected emitter terminals.

Such transistors, designated by the reference numerals 6, 7 and Q5, are respectively connected, by their collector terminals, to the node reached by the current I1 (for the transistor 6), to a collector terminal of an additional NPN bipolar transistor Q6, and to the collector terminal of a transistor Q7. The emitter terminals of the transistors Q6 and Q7 are connected to the supply voltage Vdd. The collector terminal of the transistor Q6 is connected to the base terminal of the same transistor. A P-type MOS transistor 5 is connected between the supply voltage Vdd and the collector terminal of the transistor Q6 and is therefore in parallel to such transistor. The MOS transistor 5, receives the voltage Vin, which is also present on the capacitor C1, which is the capacitor that controls the transition times.

The circuit according to the invention allows, if the value of R1 increases, to decrease the value of the term V/R1 and therefore increase the difference (I1−V/R1). By choosing I1, V and R1 appropriately, it is therefore possible to achieve a variation of I which is proportional to the variation of R (degeneration resistor). In this manner, by replacing the equation of the current I given above in the equation that defines the switching times Ts,d (related to the circuit of FIG. 3), Ts,d=A*IL*C [R/(I1−V/R1)] is obtained. Experimental tests have shown that the above-defined current I provides compensation for the variations in the resistor R of the differential stage, keeping substantially unchanged the switching times of the current pulse generator in the presence of variations of the value of the degeneration resistors R due to process and temperature variations.

In practice it has been observed that the generator according to the invention fully achieves the intended objects, since it obtains current pulses with controlled and substantially unchanged switching times with low electromagnetic emission. The generator described above is susceptible to numerous modifications and variations, all of which are within the scope of the invention. All the details may also be replaced with other technically equivalent elements. The disclosure in Italian Patent Application No. MI98A002724 from which this application claims priority is incorporated herein by reference.

That which is claimed is:

1. A current pulse generator with process-independent and temperature-independent symmetric switching times, comprising:

a differential stage having resistors, for generating a transmission current;

a driving circuit for generating a control voltage for the differential stage; and a compensation circuit for compensating for variations in the values of the resistors of the differential stage, and for generating, with the driving circuit, a current for controlling the differential stage to keep switching times of current pulses of the current pulse generator substantially unchanged and symmetrical despite temperature and manufacturing variations of the current pulse generator, the compensation circuit comprising an operational amplifier which receives a constant current at an inverting terminal and a voltage at a non-inverting terminals, and a resistor connected to the inverting terminal of the operational amplifier, the resistor having parameter variations due to process and temperature variations which are equal to variations of the resistors.

2. A current pulse generator according to claim 1, wherein the differential stage further comprises two bipolar transistors and a current source, and wherein the resistors are connected to the emitter terminals of the bipolar transistors and are biased by the current source.

3. A current pulse generator according to claim 1, wherein first, second and third bipolar transistors are connected to the output of the operational amplifier, with common-connected base terminals and with ground-connected emitter terminals.

4. A current pulse generator according to claim 3, wherein the collector terminal of the first transistor is connected to the inverting terminal of the operational amplifier.

5. A current pulse generator according to claim 3, further comprising a fourth bipolar transistor and a fifth bipolar transistor in which the base terminals are common-connected and the emitter terminals are connected to a supply voltage, and wherein the collector terminals of the second and third transistors are respectively connected to the collector terminals of the fourth and fifth bipolar transistors.

6. A current pulse generator according to claim 5, further comprising:

a charging capacitor arranged upstream of the differential stage and in parallel to the third transistor; and a P-channel MOS transistor connected to the fourth transistor and receives, at its source terminal, an input voltage which is sent to the charging capacitor.

7. A current pulse generator according to claim 5, wherein the fourth and fifth transistors are PNP bipolar transistors.

8. A current pulse generator according to claim 3, wherein the first, second and third transistors are NPN bipolar transistors.

9. A current pulse generator comprising:

a differential stage having resistors;

a driving circuit for the differential stage; and a compensation circuit for compensating for the variations in values of the resistors and for generating, with the driving circuit, a signal for controlling the differential stage to keep switching times of current pulses of the current pulse generator substantially unchanged and symmetrical despite at least one of temperature and manufacturing variations of the current pulse generator, the compensation circuit comprising an operational amplifier which receives a constant current at an inverting terminal and a voltage at a non-inverting terminals, and a resistor connected to the inverting terminal of the operational amplifier, the resistor having parameter variations due to process and temperature variations which are equal to variations of the resistors.

10. A current pulse generator according to claim 9, wherein the current pulse generator has process-independent and temperature-independent symmetric switching times.

11. A current pulse generator according to claim 9, wherein the differential stage further comprises two bipolar transistors and a current source, and wherein the resistors are connected to emitter terminals of the bipolar transistors and are biased by the current source.

12. A current pulse generator according to claim 9, wherein first, second and third bipolar transistors are connected to the output of the operational amplifier, with common-connected base terminals and with ground-connected emitter terminals.

13. A current pulse generator according to claim 12, wherein the collector terminal of the first transistor is connected to the inverting terminal of the operational amplifier.

14. A current pulse generator according to claim 12, further comprising a fourth bipolar transistor and a fifth bipolar transistor in which the base terminals are common-connected and the emitter terminals are connected to a supply voltage, and wherein the collector terminals of the second and third transistors are respectively connected to the collector terminals of the fourth and fifth transistors.

15. A current pulse generator according to claim 14, further comprising:

a P-channel MOS transistor connected to the fourth transistor and receives an input voltage at a source terminal; and a charging capacitor connected upstream of the differential stage and in parallel to the third transistor, the charging capacitor also receiving the input voltage.

16. A current pulse generator according to claim 14, wherein the fourth and fifth bipolar transistors are PNP bipolar transistors.

17. A current pulse generator according to claim 12, wherein the first, second and third bipolar transistors are NPN bipolar transistors.

18. A telephony device for receiving, processing and transmitting data comprising:
   a current pulse generator with process-independent and temperature-independent symmetric switching times comprising
      a differential stage having resistors,
      a driving circuit for the differential stage, and
      a compensation circuit for compensating for variations in the values of the resistors and for generating, with the driving circuit, a signal for controlling the differential stage to keep switching times of current pulses of the current pulse generator substantially unchanged and symmetrical despite temperature and manufacturing variations of the current pulse generator.

19. A device according to claim 18, wherein the differential stage further comprises two bipolar transistors and a current source, and wherein the resistors are connected to emitter terminals of the bipolar transistors and are biased by the current source.

20. A device according to claim 18, wherein the compensation circuit comprises:
   an operational amplifier which receives a constant current at an inverting terminal and a voltage at a non-inverting terminals; and
   a resistor connected to the inverting terminal of the operational amplifier, the resistor having parameter variations due to process and temperature variations which are equal to variations of the resistors.

21. A device according to claim 20, wherein first, second and third bipolar transistors are connected to the output of the operational amplifier, with common-connected base terminals and with ground-connected emitter terminals.

22. A device according to claim 21, wherein the collector terminal of the first transistor is connected to the inverting terminal of the operational amplifier.

23. A device according to claim 21, further comprising a fourth bipolar transistor and a fifth bipolar transistor in which the base terminals are common-connected and the emitter terminals are connected to a supply voltage, and wherein the collector terminals of the second and third transistors are respectively connected to the collector terminals of the fourth and fifth transistors.

24. A device according to claim 23, further comprising:
   a P-channel MOS transistor connected to the fourth transistor and receives an input voltage at a source terminal; and
   a charging capacitor connected upstream of the differential stage and in parallel to the third transistor, the charging capacitor also receiving the input voltage.

25. A device according to claim 23, wherein the fourth and fifth bipolar transistors are PNP bipolar transistors.

26. A device according to claim 21, wherein the first, second and third bipolar transistors are NPN bipolar transistors.

27. A method of controlling a current pulse, generator including a differential stage having resistors, the method comprising:
   generating a control voltage for the differential stage; and
   compensating for variations in the values of the resistors and generating a signal for controlling the differential stage to keep switching times of current pulses of the current pulse generator substantially unchanged and symmetrical despite temperature and manufacturing variations of the current pulse generator, wherein compensating comprises
      providing an operational amplifier which receives a constant current at an inverting terminal and a voltage at a non-inverting terminals, and
      providing a resistor connected to the inverting terminal of the operational amplifier, the resistor having parameter variations due to process and temperature variations which are equal to variations of the resistors.

28. A method according to claim 27, wherein the current pulse generator is controlled to have process-independent and temperature-independent symmetric switching times.

29. A method according to claim 27, wherein the differential stage further comprises two bipolar transistors and a current source, and wherein the resistors are connected to emmitter terminals of the bipolar transistors and are biased by the current source.

30. A method according to claim 27, wherein first, second and third bipolar transistors are connected to the output of the operational amplifier, with common-connected base terminals and with ground-connected emitter terminals.

31. A method according to claim 30, wherein the collector terminal of the first transistor is connected to the inverting terminal of the operational amplifier.

32. A method according to claim 30, further comprising a fourth bipolar transistor and a fifth bipolar transistor in which the base terminals are common-connected and the emitter terminals are connected to a supply voltage, and wherein the collector terminals of the second and third transistors are respectively connected to the collector terminals of the fourth and fifth transistors.

33. A method according to claim 32, further comprising the steps of:
   providing a P-channel MOS transistor connected to the fourth transistor and for receiving an input voltage at a source terminal; and
   providing a charging capacitor connected upstream of the differential stage and in parallel to the third transistor, the charging capacitor also receiving the input voltage.

34. A device for receiving, processing and transmitting data comprising:
   a current pulse generator comprising
      a differential stage having resistors,
      a driving circuit for the differential stage, and
      a compensation circuit for compensating for variations in the values of the resistors and for generating, with the driving circuit, a signal for controlling the differential stage to keep switching times of current pulses of the current pulse generator substantially unchanged and symmetrical despite temperature and manufacturing variations of the current pulse generator, the compensation circuit comprising
         an operational amplifier which receives a constant current at an inverting terminal and a voltage at a non-inverting terminals, and
         a resistor connected to the inverting terminal of the operational amplifier, the resistor having parameter variations due to process and temperature variations which are equal to variations of the resistors.

35. A device according to claim 34, wherein the current pulse generator has process-independent and temperature-independent symmetric switching times.

36. A device according to claim 34, wherein the differential stage further comprises two bipolar transistors and a current source, and wherein the resistors are connected to emitter terminals of the bipolar transistors and are biased by the current source.

* * * * *

UNITED STATES PATENT AND TRADEMARK OFFICE
CERTIFICATE OF CORRECTION

PATENT NO. : 6,313,684 B1
DATED : November 6, 2001
INVENTOR(S) : Gregorio Bontempo Page 1 of 1

It is certified that error appears in the above-identified patent and that said Letters Patent is hereby corrected as shown below:

Column 5,
Line 45, delete "non-inverting terminals," insert -- non-inverting terminal, --

Column 6,
Line 27, delete "non-inverting terminals," insert -- non-inverting terminal, --

Column 7,
Line 23, delete "terminals;" insert -- terminal; --
Line 67, delete "non-inverting terminals," insert -- non-inverting terminal, --

Column 8,
Line 12, delete "emmitter" insert -- emitter --
Line 53, delete "non-inverting terminals," insert -- non-inverting terminal, --

Signed and Sealed this

Thirtieth Day of April, 2002

Attest:

JAMES E. ROGAN
Attesting Officer
Director of the United States Patent and Trademark Office